United States Patent [19]

Bletz et al.

[11] Patent Number: 4,694,155
[45] Date of Patent: Sep. 15, 1987

[54] CIRCUIT ARRANGEMENT TO ASCERTAIN AND INDICATE THAT A LUMINOUS DENSITY LIMIT CONDITION IS EXCEEDED

[75] Inventors: Walter Bletz, Braunfels; Rolf Magel, Fernwald, both of Fed. Rep. of Germany

[73] Assignee: Ernst Leitz Wetzlar GmbH, Wetzlar, Fed. Rep. of Germany

[21] Appl. No.: 757,881

[22] Filed: Jul. 23, 1985

[30] Foreign Application Priority Data

Jul. 23, 1984 [DE] Fed. Rep. of Germany ....... 3427055
Jun. 22, 1985 [DE] Fed. Rep. of Germany ....... 3447982

[51] Int. Cl.$^4$ ............................................. H01J 40/14
[52] U.S. Cl. ............................... 250/214 R; 250/214 L
[58] Field of Search ....................... 250/214 R, 214 L; 356/223, 224, 227; 354/427, 428

[56] References Cited

U.S. PATENT DOCUMENTS

| | | | |
|---|---|---|---|
| 3,956,757 | 5/1976 | Nomura et al. | 354/427 |
| 3,994,595 | 11/1976 | Nobusawa | 356/227 |
| 4,040,068 | 8/1977 | Nanba et al. | 354/428 |
| 4,247,186 | 1/1981 | Uchidoi et al. | 356/223 |

FOREIGN PATENT DOCUMENTS 2552863 11/1975 Fed. Rep. of Germany .
2822035 11/1979 Fed. Rep. of Germany .
3225211 1/1983 Fed. Rep. of Germany .

Primary Examiner—David C. Nelms
Assistant Examiner—S. Allen
Attorney, Agent, or Firm—Schwartz, Jeffery, Schwaab, Mack, Blumenthal & Evans

[57] ABSTRACT

A circuit containing a photodiode for determining when there is sufficient illumination for an optical device to operate having provision for compensating signal variations due to temperature-dependent operation of the photodiode by supplying logarithmic means with an input from a potentiometer connected to a temperature-dependent distributor circuit.

6 Claims, 1 Drawing Figure

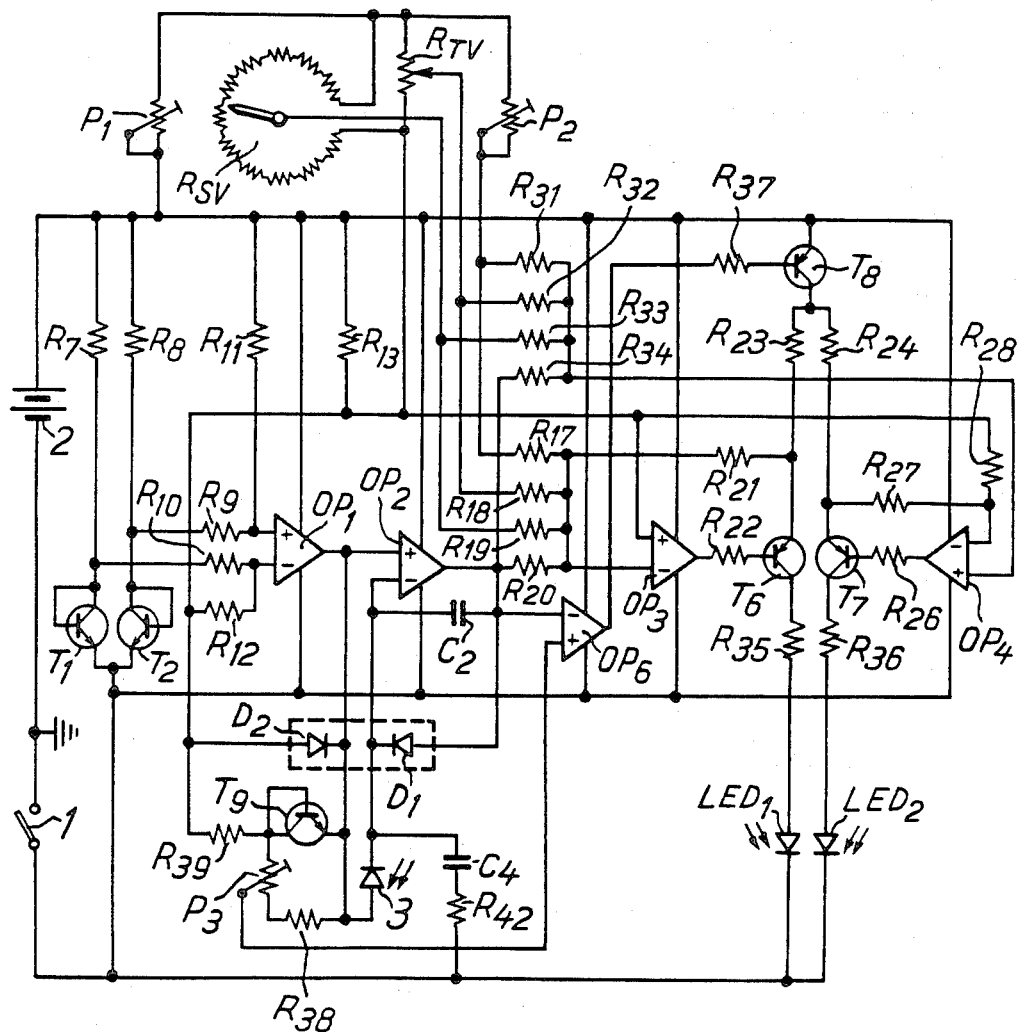

CIRCUIT ARRANGEMENT TO ASCERTAIN AND INDICATE THAT A LUMINOUS DENSITY LIMIT CONDITION IS EXCEEDED

BACKGROUND OF THE INVENTION

The present invention pertains to a circuit arrangement to ascertain and indicate that a luminous density limit condition is exceeded, wherein a comparator compares a temperature-dependent measurement value produced by taking the logarithm of a current value from a photoelectric diode with a determinable limit value containing an adjustable temperature dependency.

It is known that semiconductor elements, e.g., photoelectric diodes, exhibit different characteristics at different temperatures.

This effect occurs in particular in the exposure meter and control circuits of photographic devices, wherein the measurement and/or the shutter control effected depends on the very slight flow of current generated in a photoelectric converter by incident light. This effect has particularly increased in significance in recent times, because photoelectric converters have become more and more sensitive, i.e., they operate at lower and lower levels of illumination, at which they also, however, deliver a smaller and smaller signal currents.

Today, the operating range of high-quality photographic cameras often extends down to exposure values approaching $E_v$-1 at 21° DIN or even farther. This corresponds to a luminous density of 0.06 cd/m$^2$. Photographs of objects at night by the full moon are thus possible. In general, cameras which measure down to such low luminous densities are equipped with silicon photoreceptors, since CdS photoresistors can no longer be employed in these cameras as a consequence of their activity at low luminous densities.

The silicon photoelectric diodes deliver signal currents of only a few pA (picoamps) at these low luminous densities. However, it is practically impossible for the user of such high-quality cameras to decide, on the basis of brightness and temperature, whether or not a photograph is still possible. When using high-speed films, achievable exposure times can result from very low scene brightness. In such circumstances, however, currents in the pA region produced in a photoelectric diode can no longer practically be processed with certainty. There is also the danger that the user will take photographs below a luminous density limit.

A difficulty exists in indicating such a luminous density limit, however, in that the currents delivered by the photoelectric diode must be compressed due to the large dynamic range.

This compression is effected, for example, by means of a semiconductor element in a logarithmic circuit. In this case a problem arises in that the virtually temperature-independent photoelectric current is translated in the semiconductor element into a voltage which is heavily temperature-dependent.

Thus, to compensate for the temperature coefficient of a semiconductor segment, it has already been suggested, in West German Laid Open Patent Application No. 28 22 035, that the voltage of the $U_{BE}$ segment of a second, identical transistor be added to the voltage of the $U_{BE}$ space of the transistor to be compensated, and that this total voltage be applied via a resistive voltage divider in a 1:1 ratio to the base-emitter space of a third transistor of the same kind, so that the collector current represents the geometric mean of the two collector currents of the first and second transistors, and thus becomes temperature-independent.

From a technological point of view, however, such a circuit arrangement is wasteful and expensive.

SUMMARY OF THE INVENTION

It is therefore an object of the present invention to provide a circuit arrangement for temperature coefficient compensation, which circuit is distinctive in its simple construction and high efficiency, and which indicates that a limit condition is exceeded. The indication of a luminous density limit thereby requires that a temperature-dependent voltage be available for comparison. The temperature-dependence of this voltage is adjustable between 0 and the corresponding value of the semiconductor element which determines the translation of the photoelectric current into a logarithmic voltage. The magnitude of the voltage is itself similarly adjustable.

These objects are met in the present invention by providing a circuit for determining and indicating that a luminous density limit is exceeded, comprising a photoelectric diode means for producing a diode signal indicative of an incident luminous density; means, arranged to receive said diode signal, for producing a logarithmic signal having an amplitude corresponding to the logarithm of the amplitude of said diode signal; circuit means for generating a determinable limit value signal having an adjustable temperature dependency comprising a potentiometer having a tap and also comprising a temperature-dependent dividing circuit connected to said potentiometer; and comparator means having a first input and a second input, said first input being connected to receive said logarithm signal and said second input being adapted to receive said limit value signal, for comparing said limit value signal and said logarithm signal and for producing a control output when said logarithm signal and said limit value signal fail to satisfy a predetermined relationship, said control output being applied to one of an indicator circuit and a processing stage.

BRIEF DESCRIPTION OF THE DRAWINGS

An exemplary embodiment of the invention is illustrated in the drawings and is described in greater detail below.

In the drawings:

FIG. 1 is a circuit diagram of the arrangement according to the invention.

DETAILED DESCRIPTION OF THE PREFERRED EMBODIMENTS

According to the present invention, a circuit arrangement of the type described above is attained by connecting one input of a comparator, in a per se known manner with the output of a logarithmic amplifier, and by connecting its other input with the tap on a potentiometer. The potentiometer is itself connected to a temperature-dependent dividing circuit. The output of the comparator affects an indicator circuit and/or a processing stage.

In the exemplary embodiment of the circuit arrangement shown in FIG. 1, an operational amplifier OP$_2$ functions as a current/voltage converter and a non-linear component D$_2$ serves for temperature compensation while measuring illumination with an electronic exposure meter, in which case a current derived from the brightness of the scene is converted into a logarithmic voltage. In this arrangement, a switch 1 switches on a current source 2. Transistors $T_1$ and $T_2$, wired as diodes, are thus connected to the supply voltage, from which they are supplied with different currents through resistors $R_7$ and $R_8$. The differential voltage resulting from these currents is amplified in an operational amplifier $OP_1$ which is feedback-coupled through resistor $R_{12}$. The output of the operational amplifier $OP_1$ is connected to one pole of a temperature compensation stage $D_2$, while another pole is connected to the feedback resistor $R_{12}$ and to variable resistors $P_1$, $P_2$, $R_{SV}$, and $R_{TV}$.

At least one calculation stage $OP_3$, with feedback resistor $R_{21}$, which lies between the emitter of a transistor $T_6$ and reference resistor $R_{23}$, follows the nonlinear component $D_1$ and the pickups of variable resistors $P_1$, $P_2$, $R_{SV}$, and $R_{TV}$ via resistors $R_{17}$ through $R_{20}$. A follower stage $OP_4$ with resistors $R_{31}$ through $R_{34}$ is furthermore provided; it is preceded by resistors $R_{27}$ and $R_{28}$, which determine amplification, and a reference resistor $R_{24}$.

When using high-speed films, a still realizable exposure time can sometimes result, in the case of very low scene brightness. That is, currents which lie in the pA (picoamp) region and which can in practice no longer be processed with certainty are produced in a photoelectric diode 3. Errors in measuring the brightness of a scene, and resulting incorrectly exposed photographs thus occur.

To avoid this, the inverting input of a comparator $OP_6$ is connected to the output of operational amplifier $OP_2$, which functions as a current/voltage converter. With the aid of this comparator, light-emitting diodes $LED_1$ or $LED_2$ at the outputs of calculation stage $OP_3$ and follower stage $OP_4$ are turned off when the light intensity of the object being measured falls below a certain limit value.

A circuit network consisting of resistor $R_{39}$, transistor $T_9$, wired as a diode, and potentiometer $P_3$ is at the non-inverting input of comparator $OP_6$.

The output of comparator $OP_6$ is connected to the base of a transistor $T_8$ through resistor $R_{37}$. If comparator $OP_6$ responds, its output becomes a positive potential. As a result of this, transistor $T_8$ becomes non-conductive. Therefore, no current flows to light-emitting diodes $LED_1$ and $LED_2$.

The circuit network consisting of resistor $R_{39}$, transistor $T_9$, potentiometer $P_3$, and resistor $R_{38}$ accordingly has the object of providing a criterion for switching off the exposure meter indicator, in the present case light-emitting diodes $LED_1$ and $LED_2$, whenever the light intensity exceeds or falls short of limit values, which are freely selected in advance at room temperatures via potentiometer $P_3$ on the exposure meter.

It is clear from known diode characteristics at various temperatures that higher inverse currents flow at higher temperatures. In the case of the present circuit arrangement, therefore, higher error currents flow to the inputs of the operational amplifiers. This also applies to the inverse currents generated by photoelectric diode 3. The operational amplifier $OP_2$ thus also receives a higher error current than at room temperature (20° C.). By means of to the circuit network described above, at a temperature of e.g., +60° C., the set light intensity limit at which the indicator should be turned off is reached two stops sooner.

The circuit arrangement in FIG. 1 further has a buffer, located between the negative pole of the supply source 2 and the inverting input of the operational amplifier $OP_2$ and consisting of resistor 42 and capacitor $C_4$. Its task is to ensure a flow of current to the indicator, consisting of light-emitting diodes $LED_1$ and $LED_2$, when the exposure meter is connected to the supply voltage.

Connecting the supply voltage allows a transient process to begin in operational amplifier $OP_2$, during which its output will then accept a "positive" supply for a short time. If this is the case, the capacitance of photoelectric diode 3 is reversed via the non-linear component $D_1$ in such a way that there is a positive charge at the inverting input of operational amplifier $OP_2$. This charge does not decay spontaneously, since the inverting input of operational amplifier $OP_2$, the photoelectric diode 3, and the non-linear component $D_1$ are very "highly resistive" in the reverse direction.

There is then a very low potential at the output of the operational amplifier $OP_2$, as a result of which comparator $OP_6$ turns off the indicator consisting of light-emitting diodes $LED_1$ and $LED_2$. However, since only a small photoelectric current is available in the lower light intensity region to reverse the photoelectric diode 3, the indicator remains off for the time being.

This temporary "failure" of the indicator is prevented by a buffer consisting of resistor $R_{42}$ and capacitor $C_4$. During the short starting pulse, capacitor $C_4$ cannot become perceptibly charged, since resistor $R_{42}$ is "highly resistive".

After the starting pulse, the cathode of photoelectric diode 3 is drawn via the buffer to the negative pole of the supply source 2, so that comparator $OP_6$ does not respond as a result. As the process continues, capacitor $C_4$ charges up to the voltage between the negative pole of supply source 2 and the potential of the working point of the non-inverting input of the operational amplifier $OP_2$, which functions as a current/voltage converter. Comparator $OP_6$ responds as a result, and transistor $T_8$ becomes conductive. The current resulting from the measurement can be measured, and current can flow through light-emitting diodes $LED_1$ and $LED_2$.

Resistor $R_{42}$ furthermore serves to stabilize the circuit.

What is claimed is:

1. A circuit for determining and indicating that a luminous density limit is exceeded, comprising:
    photoelectric diode means for producing a diode signal indicative of an incident luminous density;
    means, arranged to receive said diode signal, for producing a logarithmic signal having an amplitude corresponding to the logarithm of the amplitude of said diode signal;
    circuit means for generating a determinable limit value signal, said circuit means having an adjustable temperature dependent circuit comprising a potentiometer having a tap and also comprising a temperature-dependent dividing circuit connected to said potentiometer; and
    comparator means having a first input and a second input, said first input being connected to receive said logarithm signal and said second input being adapted to receive said limit value signal for comparing said limit value signal and said logarithm signal and for producing a control output signal when said logarithm signal and said limit value signal fail to satisfy a predetermined relationship, said control output signal being applied to an indicator circuit and a processing stage.

2. A circuit as claimed in claim 1, wherein said temperature-dependent dividing circuit comprises a resistor and a semiconductor component connected in series with said resistor, said tap of said potentiometer being connected between said resistor and said semiconductor component.

3. A circuit as claimed in claim 2, wherein said semiconductor component comprises a transistor wired as a diode.

4. A circuit arrangement as claimed in claim 2, further comprising a calculation circuit arranged to receive said logarithm signal, to process said logarithm signal to produce a calculated output signal, and to apply said calculated output signal to said indicator circuit.

5. A circuit arrangement as claimed in claim 1, further comprising a calculation circuit arranged to receive said logarithm signal, to process said logarithm signal to produce a calculated output signal, and to apply said calculated output signal to said indicator circuit.

6. A circuit arrangement as claimed in claim 1, further comprising an auxiliary circuit arranged to supply a flow of current to said indicator circuit immediately after the circuit arrangement is connected to a voltage supply source.

* * * * *